United States Patent
Ambrugger et al.

(10) Patent No.: US 6,798,133 B1
(45) Date of Patent: Sep. 28, 2004

(54) GLASS COVER AND PROCESS FOR PRODUCING A GLASS COVER

(75) Inventors: Alois Ambrugger, Iffeldorf (DE); Christoph Hamann, Williamsburg, VA (US); Wolfgang Rogler, Moehrendorf (DE); Wolfgang Roth, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 38 days.

(21) Appl. No.: 10/070,604
(22) PCT Filed: Sep. 7, 2000
(86) PCT No.: PCT/DE00/03108
§ 371 (c)(1),
(2), (4) Date: Aug. 2, 2002
(87) PCT Pub. No.: WO01/18886
PCT Pub. Date: Mar. 15, 2001

(30) Foreign Application Priority Data

Sep. 9, 1999  (DE) .......................... 199 43 148

(51) Int. Cl.[7] ................................ H01J 63/04
(52) U.S. Cl. ......................... 313/498; 445/24
(58) Field of Search ................ 313/498–512; 445/24, 25

(56) References Cited

U.S. PATENT DOCUMENTS 6,520,821 B1 * 2/2003 Ishii et al. .................. 313/512

FOREIGN PATENT DOCUMENTS

| EP | 1366678 | 9/1974 |
|----|---------|--------|
| EP | 0 910 228 A1 | 4/1999 |
| EP | 0 969 700 A1 | 1/2000 |
| EP | 0 776 147 B1 | 8/2001 |
| EP | 0 781 075 B1 | 12/2001 |

* cited by examiner

Primary Examiner—Joseph Williams
(74) Attorney, Agent, or Firm—Harness, Dickey & Pierce, P.L.C.

(57) ABSTRACT

A component includes a glass substrate, an organic light-emitting diode arranged on the glass substrate, and a glass cover arranged over the organic light-emitting diode. The glass cover is glued to the edge to the glass substrate. The cover is one produced from a glass plate by three-dimensional removal of material using a blasting method.

21 Claims, 1 Drawing Sheet

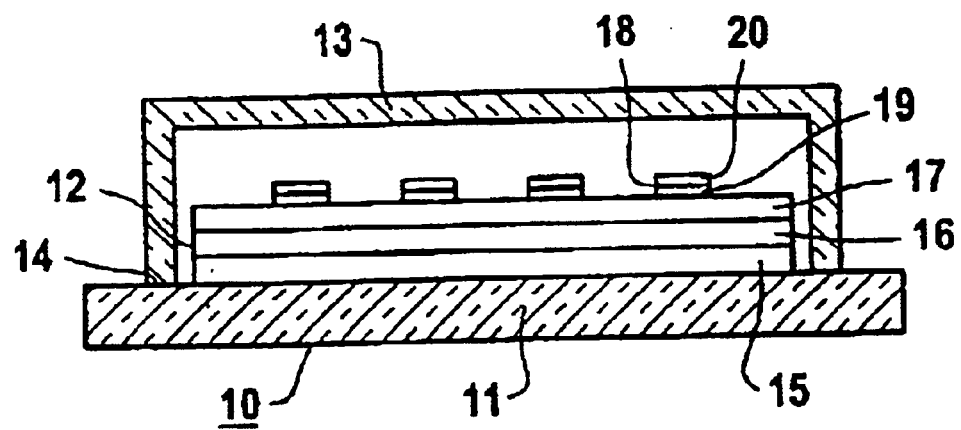

GLASS COVER AND PROCESS FOR PRODUCING A GLASS COVER

This application is the national phase under 35 U.S.C. §371 of PCT International Application No. PCT/DE00/03108 which has an International filing date of Sep. 7, 2000, which designated the United States of America, the entire contents of which are hereby incorporated by reference.

FIELD OF THE INVENTION

The invention generally relates to components and to a process for producing components.

BACKGROUND OF THE INVENTION

Components feature an optoelectronic functional unit which is generally arranged on a substrate, in particular a glass substrate. The optoelectronic functional unit may he a light-emitting diode (LED); for example, an organic light-emitting diode (OLED).

LEDs and OrEDs are composed of two or more functional layers and have, for example, the following structure (in this respect see: "Philips Journal of Research", Vol. 51 (1998), pages 467 to 477): a thin ITO (indium tin oxide) layer as transparent electrode, a conducting polymer layer, an electroluminescent layer, i.e., a layer of light-emitting material. in particular of a light-emitting polymer, and an electrode made of a metal with a low work function.

Since some of the materials used to construct LEDs and OIDs are very sensitive toward water and oxygen, they must be protected from environmental influences by capsuling; in other words, they are arranged within a housing. This can be done, for example, by covering the LED or OLED, arranged on a glass substrate, with a glass plate and adhesively bonding this glass plate to the glass substrate (in this respect see: "Applied Physics Letters", Vol. 65 (1994), pages 2922 to 2924). Adhesive bonding is carried out using, for example, an epoxy resin. In this case, however, a relatively thick adhesive joint is needed, with the consequence that moisture may penetrate the cavity between glass substrate and glass plate by way of the adhesive film.

Additionally, an electroluminescent system has already been disclosed in which the housing within which the electroluminescent unit, which has an electroluminescent organic layer, is enclosed comprises a layer of a low-melting metal or of a corresponding alloy which is attached using an adhesive film to a substrate which bears the electroluminescent unit (see: WO97/46052). Although the electroluminescent system can be made highly impervious by this method, the method is associated with a high degree of complexity and high cost. A further disadvantage is that the relatively high temperatures needed to process the metal or alloy from the melt may result in damage to the electroluminescent unit.

The same applies in principle to a process wherein the organic functional unit, particularly an OLED, is encapsulated using glass solder (German patent application file ref. 198 45 075.3). In OLEDs, the temperatures required for processing glass solders presently available lead to damage to the functional organic materials. In this case, furthermore an additional frame is disposed between the lid of the housing and the glass substrate in order to prevent mechanical damage to the OID structure. This, however, means additional worksteps and adhesive joints, which are associated with the risk of perviousness.

EP-A0 776 147 discloses an organic electroluminescent system in which the light-emitting diode is arranged in an airtight container in order to shield it from the external atmosphere. In the interior of the container, but separated from the diode, moreover, there is a substance for chemical absorption of moisture. The container is composed of a sealing housing, a transparent substrate which covers this housing, and a sealant which binds the substrate to the housing. Housing and substrate may be composed of glass.

Glass housings are normally produced by casting or forming, i.e., pressing. The resulting containers, however, are not very precise and the surfaces are smooth. Moreover, the surfaces are not sufficiently planar. However, when sealing OLEDs the bond surfaces must be planar, with a tolerance of a few micrometers. With containers of this kind, therefore. laborious machining of the bond surfaces is necessary.

SUMMARY OF THE INVENTION

It is an object of an embodiment of the invention to design components comprising an optoelectronic functional unit. This can be done, for example, in such a way that on the one hand the functional unit is hermetically capsuled, i.e., is not adversely affected by environmental effects such as water and air, and also cannot be damaged mechanically. Further, on the other hand, the capsuling can be realized relatively simply.

This can be achieved in accordance with an embodiment of the invention by components which comprise the following elements:

- a glass substrate
- an organic light-emitting diode arranged on said glass substrate, and
- a glass cover which is arranged over the organic light-emitting diode and is glued at the edge to the glass substrate, said cover being produced from a glass plate by three-dimensional removal of material using a blasting method.

In the components of the embodiment of the invention, the glass cover together with the glass substrate forms a stable cavity within which the OLED is arranged; mechanical damage is hence impossible. Damage caused by environmental effects also does not occur, since the components are hermetically capsuled, i.e., imperviously sealed, for which only a very narrow adhesive joint is necessary.

The use of glass covers—instead of metal coverings—in conjunction with glass substrates has the advantage that glasses with an adapted thermal expansion coefficient can be used. As a result, it is possible to reduce the mechanical stress on the adhesive joint, such as occurs, for example, owing to a thermal loading of the component by temperature cycles.

The glass cover, which combines the functions of covering and frame, is produced from a glass plate by three-dimensional removal of material using a blasting method. In this procedure a recess of defined geometry and depth is formed with a high level of precision. A procedure of this kind is known in principle, specifically for making ink troughs and aperts in the coverglasses of ink printheads (in this respect see: DE-C40 18 132).

The glass covers may be produced by sandblasting, i.e., using quartz sand. Examples of other blasting materials that can be used include aluminum oxide, silicon oxide, silicon carbide or boron carbide.

The removal of material from the glass plate preferably takes place by blast machining. This manufacturing process and the blasting materials it uses can be found in DIN 8200. The removal rate and achievable depth of the recess are dependent on the relative movement between workpiece and blasting nozzle, on the nature of the blasting material, on its average diameter, on the blasting pressure, and on the distance of the nozzle from the substrate.

The glass covers of the invention can thus be produced simply and there is no need for any laborious subsequent machining such as is the case with glass housings produced in the customary manner. The glass housings, moreover, arm produced individually, and must therefore be individually positioned and processed for adhesive bonding. Individual processing, however, is expensive and unsuited to the mass manufacture which is normal in the display industry.

In contrast, the glass covers of the invention may be produced very simply even in large panels. In the display industry, panel sizes of 16 inch×16 inch or more are nowadays the norm. The glass covers needed for this purpose must be able to be produced in the same panel size for a mass manufacturing process. This is very easy to realize by structuring corresponding glass plates using photolithographic processes and producing, for example, up to 150 recesses—of the desired shape and depth—in the glass plate via a blasting method. Individualization may then take place by known processes and in general occurs only after the joining procedure. One particularly preferred variant of an embodiment of the invention therefore includes producing a large number of recesses in a glass panel in a single operation, in accordance with a layout which is predetermined by the display to be encapsulated, and carrying out individualization only after encapsulation. An additional advantage is that virtually any desired shape can be produced by simple photolithographic structuring.

It is further of advantage if the inner surface of glass covers produced by a blasting method, i.e., the inside of the cover, has been roughened. Where getter materials are additionally used in order to bind moisture or oxygen, indeed, inorganic materials can be deposited by vapor deposition on the rough surface with long-term stability. Getter substances dispersed in an organic adhesive can also be bonded with long-term stability to the rough inside of the cover.

The glass adherends, i.e., glass cover and glass substrate, normally have a relatively smooth surface at their sites in common. In certain circumstances, this may lead to problems with wetting and thus adhesion in the context of adhesive bonding, possibly resulting in an adhesive joint of reduced imperviousness.

An embodiment of the invention therefore preferably envisages the glass cover having a certain roughness at the edge, i.e., at the sites which are bonded to the glass substrate. This is achieved by roughening these sites superficially. The roughening, i.e., the surface treatment or surface modification of the edge of the glass cover, takes place advantageously in a manner corresponding to that of the production of the glass cover itself; in other words, by removal of material using a blasting method. By observing certain method parameters (blasting material, blasting pressure, blasting distance, and blasting time), it is possible to remove only a very small amount of material.

As a result of the surface treatment, the glass attains a roughness which leads to an increase in the surface area and hence to improved wetting and attachment of the adhesive in the joining process; the roughness of the glass surface can be adjusted within a wide range. Furthermore, the surface treatment removes from the surface of the glass all impurities which are adsorbed on the glass, and which originate, for example, from the glass manufacturing process and which could adversely affect the imperviousness of the adhesive joint. This does away with complex cleaning steps prior to the joining of the glass parts. Furthermore, because of the improved wetting behavior, there is no restriction on the choice of adhesive.

The glass cover can be advantageously bonded to the glass substrate using an organic adhesive. For this purpose it is preferred to use an epoxy resin.

With particular advantage, the adhesive used can be a UV-curable adhesive. The use of an adhesive of this kind is of advantage for the encapsulation of OLEDs since the adhesive is cured on the one hand with economical rapidity and on the other hand in a manner which is gentle on the materials, at low temperatures.

A particular advantage of glass covers produced using a blasting method arises when a UV-curable adhesive is used. In fact it is the case, owing to the choice of blasting conditions, that in the course of the blasting method the roughness of the inside of the cover can be made such that incident light rays arm reflected with very substantial diffusion. As a result, the energy of the light rays is reduced to such an extent that any radiation damage to the light-emitting diode, i.e., to the materials located on the glass substrate, can be prevented completely. This is especially advantageous when the glass cover is bonded using a UV-curable adhesive, since in that case there is no need to shade off radiation-sensitive areas.

With the components of an embodiment of the invention, the organic light-emitting diodes which are to be encapsulated by means of a glass cover are produced in accordance with known techniques. These techniques are, for example, spin coating, when processing polymer solutions, or vapor deposition, when processing monomers. The substrates used are ITO-coated glasses (ITO=indium tin oxide), and the ITO may also have been structured. ITO is transparent and is used as the anode on account of its electrical properties. Where required, auxiliary layers, such as hole-conducting and electron-conducting layers, are used. As the cathode, metals, such as calcium, are applied by vapor deposition. The parts to be joined consist of a glass substrate, on which the organic light-emitting diode is located, and a glass cover. The adherends are positioned relative to one another in an inert atmosphere—that is, in particular, an atmosphere free of oxygen and water—and are bonded to one another using, for example, an organic adhesive.

BRIEF DESCRIPTION OF THE DRAWINGS

The invention will be illustrated with reference to working examples and a FIGURE, wherein the FIGURE illustrates a cross section of a component.

DETAILED DESCRIPTION OF THE PREFERRED EMBODIMENT

The FIGURE—which is not to scale—shows a diagrammatic cross section through a component 10 of the invention. An organic light-emitting diode (OLED) 12 is arranged on a glass substrate 11. The OLED 12 is covered by a glass cover 13 which is glued at the edge 14 to the glass substrate 11. The OLED 12 includes the following constituents: a transparent electrode 15, made of ITO, for example, an organic hole transport material 16, made for example of a conducting polymer, an organic electroluminescent material 17, for example, a light-emitting polymer, and a metal electrode 18, which is composed, for example, of calcium 19 and silver 20. The organic electroluminescent material 17, i.e., the emitter (chromophore), serves simultaneously as electron transport material. However, it is also possible for the two functions to be separate, in which case the electron transport material is arranged between metal electrode and emitter.

EXAMPLE 1

Production of Organic Light-emitting Diodes

In order to produce light-emitting diodes based on polymers, two parallel ITO strips 2 mm wide at a distance of 1 cm from one another are produced by photolithography on an ITO-coated glass substrate (edge length: 4 cm×4 cm, thickness: 1.1 mm). Areas exposed to light are not detached in an alkaline medium; by this, the ITO is protected. Bare ITO is detached with conc. HBr. Atop the ITO-structured glass substrate there is applied, by spin coating from aqueous solution, a 70 nm layer of commercial polyethylene-dioxothiophene (PEDOT). This layer is dried using a heat treatment process. Subsequently, again by spin coating, this time from xylene, an emitter layer composed of a commercial polyfluorene derivative is applied, with a thickness of 100 nm. This layer is dried under a pressure of $10^{-6}$ mbar. Under the same pressure, two strips of calcium each 2 mm wide and at a distance of 1 cm are applied as cathodes by vapor deposition through a shadow mask. These metal strips are arranged at right angles to the ITO structures on the glass substrate. The areas of the intersecting anode and cathode tracks between which the polymers are located represent the active area of the light-emitting diode. Again using a shadow mask, silver strips with a thickness of 150 nm are applied by vapor deposition to the calcium strips. At the sites to be bonded, however, no metal is applied; at these sites, instead, the organic layers are removed manually.

For test purposes, four diodes produced in this way arm encapsulated using a glass cover. The external dimensions of the cover art 24 mm×24 mm (thickness: 1.1 mm), the adhesion edge is 1 mm, and the depth of the recess is 500 μm. The adherends are positioned relative to one another in an oxygen-free and water-free atmosphere and are bonded to one another, using an organic adhesive. When, for example, a voltage of 5 V is applied to the outgoing ITO and Ca/Ag lines at the edge of the glass substrate in this component, the encapsulated diode lights up green.

EXAMPLE 2

Production of Glass Covers with a Smooth Adhesion Edge

The glass covers are produced using plane-parallel glass plates 1.1 mm thick. The glass plates are cleaned with acetone in an ultrasound bath for 10 minutes and then in an oxygen plasma for 5 minutes. The surface of the glass is then photostructured. This is done by laminating on a photostructurable film (thickness 75 μm). based for example on acrylic resin, under moderate pressure at 100° C. An alternative to the film, however, is to apply a photoresist—by spin coating or screen printing. Subsequently. the film is exposed to UV light through a Cr exposure mask. The exposure time is chosen so that the material remains soft. A completely hardened film, indeed, would be brittle and would be damaged during the blasting process. Development in the present case is alkaline, using for example aqueous 1% strength $Na_2CO_3$ solution. In this procedure the unexposed sites, where blast machining is to take place, are detached. These sites correspond to the recesses that are to be produced. The glass plates are then protected by an elastic polymer mask at those points where no removal of material is to take place during the blast machining process—that is at the edges.

For blast machining, the blasting material used is preferably a commercial crystal corundum having an average particle size of 30 μm. Using a blasting pressure of preferably 5 bar, an injector blasting nozzle (as blasting nozzle), a nozzle/workpiece distance of 80 mm, and an adapted relative movement between workpiece and blasting nozzle, recesses with a depth of 500 nm can be obtained in a blasting time of 10 minutes. After the recesses have been produced, the photoresist film or photoresist protecting the edges of the cover is removed. This is done using an alkaline medium, aqueous $Na_2CO_3$ solution for example. This is followed, where necessary, by the individualization of the glass covers, by sawing or breaking, for example.

EXAMPLE 3

Production of Glass Covers with a Rough Adhesion Edge

For the production of glass covers with a roughened adhesion edge, a procedure corresponding to example 2 is followed to start with. The critical difference is that after the recess has been produced the resist layer protecting the edges of the cover is detached in an alkaline medium. The edges of the cover that then lie bare are subjected to a blast machining method. This is done by flat overblasting at low pressure, preferably 3 bar. The blasting material used is corundum having an average particle size of 9 μm. In a blasting time of 30 seconds, glass cover edges with a roughness of about 30 rms are produced. The desired roughness can be set within wide limits by the particle size and blasting time.

Here again, where necessary, the blast covers are individualized in the last step by known techniques, such as sawing or breaking.

EXAMPLE 4

Production of Components

The parts that are to be joined for the production of the components, i.e., the glass substrate with the organic light-emitting diodes located on it and the glass covers, are positioned relative to one another in an atmosphere which in particular is oxygen-free and water-free and are bonded to one, another. Bonding is carried out using an organic adhesive, preferably a UV-curable epoxy resin. The adhesive is applied by capillary gluing or automatically by means of a dispenser; curing takes place with UV light in a suitable wavelength range. This procedure can be followed both with glass covers having a smooth adhesion edge and with glass covers having a rough adhesion edge.

EXAMPLE 5

Testing of the Components with Capsuled Organic Light-emitting Diodes

Components produced in accordance with example 4 are stored in a conditioning chamber at a temperature of 85° C. and a relative humidity of 85%. Components in which the diodes have been capsuled with a glass cover produced by mechanical milling are stored under corresponding conditions. Whereas in the case of these components the diodes failed after just 48 hours, with the components of the invention it was possible to improve the service life of the diodes to more than 160 hours, and to do so for glass covers both with a smooth adhesion edge and with a rough adhesion edge.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A component, comprising:

a glass substrate;

an organic light-emitting diode arranged on said glass substrate;

a glass cover, arranged over the organic light-emitting diode and glued at an edge to the glass substrate, said cover being produced from a glass plate by three-dimensional removal of material using a blasting method using commercial crystal corundum having an average particle size of 30 $\mu$m and a blasting pressure of 5 bar; and wherein the edge of the glass cover has been superficially roughened.

2. The component of claim 1, wherein the glass cover is bonded to the glass substrate using an organic adhesive.

3. The component of claim 2, wherein the adhesive is UV-curable.

4. The component of claim 3, wherein the adhesive is an epoxy resin.

5. The component of claim 2, wherein the adhesive is an epoxy resin.

6. The component of claim 1, wherein the glass cover is bonded to the glass substrate using an organic adhesive.

7. The component of claim 6, wherein the adhesive is UV-curable.

8. The component of claim 7, wherein the adhesive is an epoxy resin.

9. The component of claim 6, wherein the adhesive is an epoxy resin.

10. A process for producing a component, comprising:

producing a plurality of recesses in a glass plate by three-dimensional removal of material using a blasting method using commercial crystal corundum having an average particle size of 30 $\mu$m and a blasting pressure of 5 bar, said recesses having edges protected by a resist layer, removing the protective resist layer of the edge; and subjecting the edges of the recesses, lying bare, to a further blasting method using corundum having an average particle size of 9 $\mu$m and a blasting pressure of only 3 bar.

11. The process of claim 10, wherein an injector blasting nozzle is used as blasting nozzle in the initial blasting method.

12. The process of claim 10, wherein the distance between nozzle and workpiece in the initial blasting method is 80 mm.

13. The process of claim 10, wherein edges having a roughness of about 30 rms are produced in the further blasting method in a blasting time of 30 seconds.

14. The process of claim 10, wherein after the recesses have been manufactured, the glass plate is used in order to encapsulate a corresponding number of organic light-emitting diodes arranged correspondingly on a substrate, and wherein, following the encapsulation, the resultant components are at least partly individualized.

15. The process of claim 10, further comprising:

encapsulating a corresponding number of organic light-emitting diodes arranged correspondingly on a substrate using the glass plate, wherein the subsequently resulting components are at least partly individualized.

16. The process of claim 10, wherein the component includes a glass substrate, an organic light-emitting diode arranged on said glass substrate, and a glass cover, arranged over the organic light-emitting diode and glued at an edge to the glass substrate, said cover being produced from a glass plate by the three-dimensional removal of material using the blasting method.

17. The process of claim 16, wherein the adhesive is an epoxy resin.

18. The process of claim 10, wherein the glass cover is bonded to the glass substrate using an organic adhesive.

19. The process of claim 18, wherein the adhesive is UV-curable.

20. The process of claim 18, wherein the adhesive is an epoxy resin.

21. The process of claim 19, wherein the adhesive is an epoxy resin.

* * * * *